(12) United States Patent
Hampel et al.

(10) Patent No.: US 6,310,814 B1
(45) Date of Patent: Oct. 30, 2001

(54) RAMBUS DRAM (RDRAM) APPARATUS AND METHOD FOR PERFORMING REFRESH OPERATIONS

(75) Inventors: Craig E. Hampel, San Jose; Richard M. Barth, Palo Alto; Paul G. Davis; Bradley A. May, both of San Jose; Ramprasad Satagopan, Sunnyvale; Frederick A. Ware, Los Altos, all of CA (US)

(73) Assignee: Rambus, Inc., Los Altos, CA (US)

( * ) Notice: Subject to any disclaimer, the term of this patent is extended or adjusted under 35 U.S.C. 154(b) by 0 days.

(21) Appl. No.: 09/637,892

(22) Filed: Aug. 8, 2000

Related U.S. Application Data

(63) Continuation of application No. 09/038,353, filed on Mar. 10, 1998, now abandoned.

(51) Int. Cl.[7] ...................................................... G11C 7/00
(52) U.S. Cl. .................... 365/222; 365/230.03; 365/203; 365/233; 365/230.08; 365/226; 365/227
(58) Field of Search .......................... 365/222, 230.03, 365/203, 233, 230.08, 236, 227, 226

(56) References Cited

U.S. PATENT DOCUMENTS

| | | | |
|---|---|---|---|
| 4,631,701 | 12/1986 | Kappeler et al. | 711/106 |
| 5,446,696 | 8/1995 | Ware et al. | 365/222 |

(List continued on next page.)

OTHER PUBLICATIONS

PCT Invitation to Pay Additional fees for PCT Counterpart Application No. PCT/US99/05132 Containing Communication Relating to Results of Partial International Search (Jun. 29, 1999).

Peter Gillingham, "SLDRAM Architectural and Functional Overview," SLDRAM Consortium, pp. 1–14, BNSDOCiD: XP 2113332A (Aug 29, 1997).

"Draft Standard for A High Speed Memory Interface (SyncLink)," Microprocessor and Microcomputer Standards Subcommittee of the IEEE Computer Society, Draft 0.99 IEEE P 1596.9–199X, XP–002113333 pp. 1–56 (Oct. 16, 1996 IEEE).

Steven A. Przybylski, "New DRAM Technologies," Section 8.4 SyncLink DRAMs (SLDRAMs), pp. 320–336 (MicroDesign Resources 1996).

PCT Notification of Transmittal of The International Search Report or The Declaration for PCT Counterpart Application No. PCT/US99/05132 Containing International Search Report (Sep. 27, 1999).

"8/9–Mbit (1Mx8/9) and 16/18–Mbit (2Mx8/9) RDRAM," Rambus Inc., Mar. 1996.

"1997 DRAM Data Book," Micron Technology, Inc., pp. i–ix, xiv–xxvii, & 1–1 to 1–44.

(List continued on next page.)

*Primary Examiner*—Andrew Q. Tran
(74) *Attorney, Agent, or Firm*—Pennie & Edmonds LLP

(57) ABSTRACT

An apparatus and method for concurrently refreshing first and second rows of memory cells in a dynamic random access memory (DRAM) component that includes a plurality of banks of memory cells organized in rows. A command interface in the DRAM component receives activate requests and precharge requests. A row register in the DRAM component indicates a row in the DRAM component. Logic in the DRAM component activates the row indicated by the row register in response to an activate request and precharges the row in response to a precharge request, the row being in a bank indicated by the activate request and by the precharge request.

40 Claims, 10 Drawing Sheets

U.S. PATENT DOCUMENTS

| | | | |
|---|---|---|---|
| 5,471,430 | 11/1995 | Sawada et al. | 365/222 |
| 5,517,454 | 5/1996 | Sato et al. | 365/222 |
| 5,568,427 | 10/1996 | Takemae | 365/189.02 |
| 5,627,791 | 5/1997 | Wright et al. | 365/222 |
| 5,764,582 | 6/1998 | Tai | 365/222 |

OTHER PUBLICATIONS

"New DRAM Technologies," 2nd ed., Steven A. Przybylski, 1994, pp. ii, ix, & 204–305.

"Synchronous Dynamic Random Access Memory (SDRAM)," Jan. 27, 1997, 4 pp. http://www/dataram.com/bytes/sdram.htm.

Godbole, Anil, "Concurrent RDRAM® User Guide", Rambus Inc, Nov. 1997.

"16/18Mbit (2Mx8/9) & 64/72Mbit (8Mx8/9) Concurrent RDRAM," Rambus Inc., Sep. 1997.

RAMBUS DRAM (RDRAM) APPARATUS AND
METHOD FOR PERFORMING REFRESH
OPERATIONS

The present application is a continuation under 37 C.F.R. § 1.53(b) of U.S. patent application Ser. No. 09/038,353, filed Mar. 10, 1998, now abandoned.

FIELD OF THE INVENTION

The present invention relates to the field of semiconductor memory, and more particularly to managing refresh and current control operations in a memory subsystem.

BACKGROUND OF THE INVENTION

The main operating memory of virtually all modern desktop and laptop computers is implemented using dynamic random access memory (DRAM) components. DRAM is relatively inexpensive and provides excellent storage density relative to other types of semiconductor memory.

A defining characteristic of DRAM is that the individual storage cells in a DRAM component usually cannot hold their charge for more than about 70 milliseconds. Consequently, to prevent loss of data, each cell in the DRAM component is periodically sensed (read) and rewritten in a refresh operation.

The fundamental aspects of DRAM refresh are the same for virtually every type of DRAM including Fast Page Mode (FPM) DRAM, Extended-DataOut (EDO) DRAM, Synchronous DRAM (SDRAM) and others. An activate operation is performed to enable the contents of a row of memory cells onto respective bitlines where they are sensed by an array of sense amplifiers. Because sensing the memory cells is destructive to the cells' contents, the outputs of the sense amplifer array are routed back to the respective bitlines to restore the appropriate charge levels to the memory cells. Thus, it is the activate operation that actually refreshes the contents of DRAM memory cells. After the activate operation is completed, a precharge operation is performed to close the sense amplifier array. In a precharge operation, memory cells in an activated row are decoupled from their respective bitlines and the sense amplifer array charges the bitlines to a voltage level that is approximately midway between the memory cell charge voltages for a "1" and a "0". The memory cells and bitlines are now ready for subsequent activation. Because the sense amplifier array output is set to the precharge voltage to charge the bitlines, any data that had been captured in the sense amplifier array is lost in the precharge operation. For this reason, a precharge operation is said to "close" the bank associated with the sense amplifier array. After a sense amplifier array has been closed, it is ready for use in a subsequent activate operation.

Because refresh operations consume DRAM bandwidth that could otherwise be used for data read and write transactions, it is desirable to reduce the time spent performing refresh operations. Unfortunately, core logic constraints and the limited command interface of most DRAM devices limits the extent to which refresh overhead can be reduced without sacrificing device operability. For example, in conventional DRAM devices there is often only one sense amplifier array. Because there is only one sense amplifier array, only one row of memory cells can be refreshed at a time and the total time to refresh all the rows in the device is simply the number of rows times the refresh time per row.

In more modern devices, such as synchronous DRAM devices (SDRAM), two sense amplifier arrays are often included within a single component. The memory cells in the SDRAM are partitioned into banks with each bank being serviced by one of the two sense amplifier arrays. Using this arrangement it is possible to perform certain interleaved operations on the different banks. For reasons discussed below, however, it is usually not possible to perform interleaved refresh operations without sacrificing the ability to place the SDRAM in a reduced power state.

SDRAM devices typically provide two modes for refresh. In one mode, called CBR refresh (Column Address Strobe Before Row Address Strobe), a CBR refresh command is issued to the SDRAM device to refresh a row and bank indicated by refresh logic within the SDRAM. The SDRAM's internal refresh logic typically includes a row counter that is incremented after each CBR refresh command to indicate the next row to be refreshed. When the SDRAM device enters a reduced power state, logic within the SDRAM continues to refresh the row indicated by the internal counter and to increment the row counter. As a result, no loss of continuity in the sequence of refreshed rows occurs when the device is transitioned between normal and reduced power states. A significant drawback to CBR refresh operation, however, is that both banks must typically be closed before a CBR refresh operation is initiated. Consequently, the potential for performing concurrent refresh operations in the respective SDRAM banks is usually not realized in CBR refresh mode and the total time to refresh a device is still the number of rows times the refresh time per row.

Another mode of refreshing an SDRAM device is a controller-sequenced refresh mode. In the controller-sequenced refresh mode, the memory controller issues activate and deactivate (precharge) commands to each row in the SDRAM in a bank alternating sequence. Because an activate operation can be performed on a row in one bank while a deactivate is being performed on a row from another bank, the controller-sequenced refresh mode allows rows from respective banks to be concurrently refreshed, thus reducing the elapsed time required to refresh the entire SDRAM device.

A significant disadvantage of the controller-sequenced mode is that it is usually difficult to place an SDRAM, operated in the controller-sequenced refresh mode, into a reduced power state without loss of data. So long as the SDRAM remains in normal (e.g., fully powered) operating state, the memory controller supplies the address of each row being refreshed and the memory controller is therefore aware, at any given time, which row is to be refreshed next. However, when the SDRAM is transitioned to a reduced power state, the SDRAM's internal row counter is used to supply the address of the row being refreshed and the row counter is periodically incremented so long as the SDRAM remains in the reduced power state. As a result, when the SDRAM is returned to the normal operating state, the address of the next row to be refreshed is typically unknown to the memory controller and a burst of refresh operations must therefore be issued to refresh each row in the SDRAM in whatever remaining time may be left in the refresh interval, tREF (tREF is the time interval within which each row in a DRAM device must be refreshed). In many SDRAM devices, it is not possible to refresh all of the rows in the SDRAM in such a remaining portion of the refresh interval so that the controller-sequenced refresh mode cannot be used with reduced power operation without the danger of some row failing to be refreshed within the proper interval. Thus, a designer using SDRAMs must usually make a choice: either use the slower CBR refresh mode so that reduced power operation can occur, or use the controller-sequenced refresh mode and disallow reduced power operation to prevent an improper refresh operation when transitioning between power states.

In another multi-bank device called the Concurrent Rambus™ DRAM (Concurrent RDRAM®) developed by Rambus, Inc. of Mountain View, Calif., a command structure is provided that allows refresh commands directed to different banks to be interleaved. However, the underlying Concurrent RDRAM core logic does not permit concurrent activate and precharge operations to be performed on different banks. Consequently, though the refresh commands may be interleaved, concurrent refresh operations are not performed.

SUMMARY OF THE INVENTION

A method and apparatus for performing concurrent refresh operations in a memory device having a dynamic memory array with at least two banks, each bank including a plurality of rows of memory cells. The memory device receives an activate request identifying a bank in which a row is to be activated. The row to be activated is specified by a row register in the memory device. The memory device performs the activate operation on the row in the identified bank in response to the activate request. The memory device receives a precharge request that specifies the bank identified in the activate request, the precharge request being received concurrently with the activate operation on the row in the identified bank. The memory device performs the precharge operation on the identified bank in response to the precharge request.

A method and apparatus for performing concurrent refresh and signal calibration operations in a DRAM component are also disclosed. Memory cells are refreshed within the DRAM component and a signaling circuit within the DRAM component is calibrated concurrently with refreshing the memory cells.

These and other features and advantages of the invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which.

DETAILED DESCRIPTION

Figure 1:
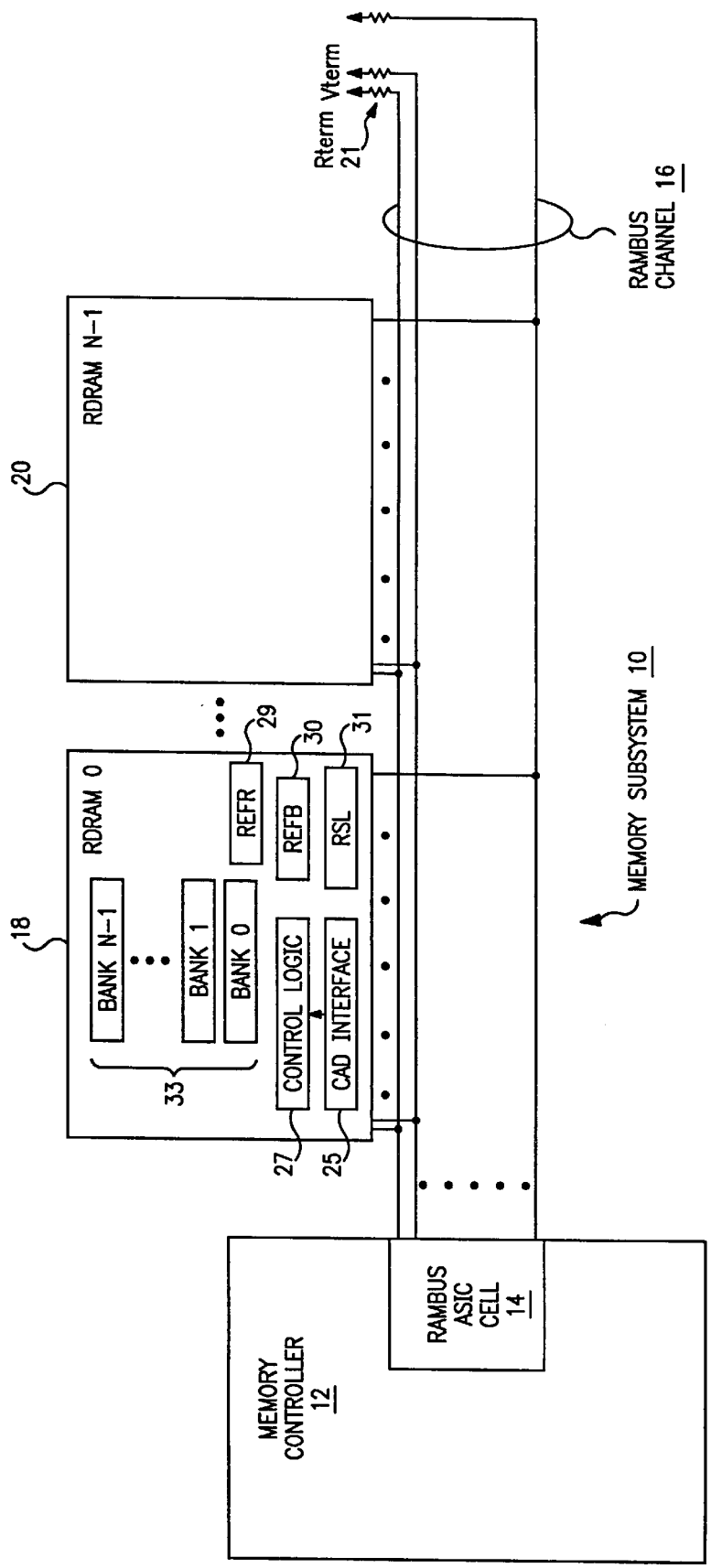
FIG. 1 depicts a memory subsystem in which embodiments of the present invention may be used.

FIG. 1 depicts a memory subsystem 10 in which embodiments of the present invention may be used. The memory subsystem 10 includes three primary components: a memory controller 12, a Rambus Channel 16 and one or more Rambus DRAMs 18, 20 (RDRAMs). The Rambus Channel 16 and RDRAM devices 18, 20 are named for their developer, Rambus, Inc. of Mountain View, Calif. Rambus and RDRAM are trademarks of Rambus, Inc. The memory subsystem 10 is intended to be a general purpose high performance memory and may be used in a broad range of applications. For example, the memory subsystem 10 may be used as a main memory or graphics memory in a computer system. The memory subsystem 10 may also be used as a memory in consumer electronics devices such as personal digital assistants or digital cameras, or in any other application where high performance data storage is required.

The memory controller 12 manages the operation of the RDRAM devices 18, 20 on the Rambus Channel 16 by transmitting various packetized commands on a command portion of the Rambus Channel 16. As discussed below, these packetized commands include read and write commands that require data to be transported to and from the RDRAM devices via a data portion of the Rambus Channel 16. The packetized commands also include commands for performing overhead operations such as refresh operations and signal calibration operations. Overhead operations usually render an RDRAM 18, 20 at least partially unavailable for read/write access and therefore reduce the overall bandwidth of the memory subsystem 10. Also, transfer of commands for performing overhead operations on the Rambus Channel 16 consumes channel bandwidth that could otherwise be used for transfer of read/write commands. Consequently, it is an intended advantage of the present invention to reduce the impact of overhead operations and associated commands on device and channel availability by concurrently transmitting overhead commands and by concurrently executing overhead operations. It is another intended advantage of the present invention to reduce the impact of overhead operations without constraining the use of other operational features of the RDRAM devices 18, 20 such as power saving features.

According to one embodiment, the Rambus Channel 16 (hereinafter "the channel") is coupled at one end to a Rambus ASIC Cell 14 in the memory controller 12 (ASIC is an acronym for application-specific integrated circuit) and at the other end to a voltage Vterm through pull-up resistors Rterm 21. Each of the RDRAM devices 18, 20 is coupled to the channel 16 between the channel's ends.

Transfer of data and commands on the channel 16 is accomplished using specialized signaling circuitry called "Rambus Signaling Logic" (RSL). RSL permits extremely high data transfer rates, with bits being present on the channel 16 in some cases for less than two nanoseconds. RSL signaling circuits within RDRAM devices 18, 20 and the Rambus ASIC Cell 14 transmit binary data on the channel 16 by enabling or disabling current flow in respective signal paths. In one embodiment, a logical "1" is transmitted on the channel 16 by causing the signaling circuit to sink a controlled current, $I_{OL}$, thus pulling the voltage of the signal path down to Von=Vterm−($I_{OL}$*Rterm). The signal swing between Von and Vterm is relatively small (e.g., 0.8 volts in one embodiment), making it possible to clock the signal paths on the channel 16 at frequencies upwards of 400 MHz. To avoid problems with clock skew, clock signals are transmitted on the channel 16 along with commands and data.

Because RSL signaling circuits produce relatively low voltage swings, a relatively small misadjustment in the on-current, $I_{OL}$, sunk by a RSL signaling circuit can result in lost or misinterpreted signals. It is important, therefore, that the on-current ($I_{OL}$) of a RSL signaling circuit be kept relatively constant across variations temperature and voltage. Consequently, in memory subsystems that include RDRAM devices it is usually necessary to periodically adjust the RSL signaling circuits to avoid drift in $I_{OL}$ due to changes in temperature and voltage. Methods for minimizing the reduction in RDRAM and channel availability due to these periodic signal calibration operations are discussed below.

Each RDRAM 18, 20 shown in FIG. 1 includes a plurality of storage banks 33, a command interface 25, Rambus Signaling Logic 31 (RSL), control logic 27 and an internal row refresh register 29 REFR and an internal bank refresh register 30 (REFB). Each RDRAM 18, 20 may also include other components not shown in FIG. 1, including sense amplifier arrays and data steering logic.

According to one embodiment, the command interface 25 within an RDRAM 18, 20 is used to receive and decode command packets from the memory controller 12 and to issue the appropriate signals to the control logic 27 in response. The control logic manages read and write access to the storage banks as well as overhead operations such as refresh and signal calibration operations. The control logic 27 also manages the transitioning of the RDRAM 18, 20 between one or more power consumption states.

The row refresh register 29 REFR, which may alternately be considered part of the control logic 27, is used to address a row within the RDRAM 18, 20 that is to be refreshed during a refresh operation. According to one embodiment, refresh operations are initiated in response to either an internal state (e.g., automatic refresh during a power saving mode) or refresh commands received from the memory controller 12. As discussed above, it is necessary to refresh each row in an RDRAM 18, 20 once per refresh interval (tREF). According to one embodiment, the refresh register 29 REFR is used to supply the address of an RDRAM row to be refreshed regardless of whether the stimulus for the refresh operation is an internal state (e.g., auto-refresh) or a command from the memory controller 12. With this design, the proper sequencing of refresh operations through the rows of the RDRAM 18, 20 is maintained despite the transition of the RDRAM 18, 20 into and out of a power saving mode in which auto-refresh is performed. This is a significant advantage over the above-described prior art techniques.

The Rambus Signaling Logic 31 (RSL) includes signaling circuits for driving state information onto a data portion of the channel 16. As discussed above, the voltage swings for these signals are relatively small and it is important that each of the signaling circuits be conditioned to enable an accurate, relatively constant drive current on the channel even through changes in temperature and voltage. In one embodiment, a biasing signal to the signaling circuits is adjusted in periodic signal calibration operations to increase or decrease the on-current, $I_{OL}$, sunk by RSL signaling circuits. While techniques for reducing the overhead associated with adjustment to current sinking circuits are described herein, the techniques may be applied to reduce the overhead associated with other types of adjustment operations in the RDRAM or memory controller 12 without departing from the spirit and scope of the present invention.

Reducing Refresh Overhead Through Concurrency in Refresh Commands and Refresh Operations According to one embodiment, the overhead associated with performing refresh operations in an RDRAM 18, 20 is reduced by performing refresh operations on respective banks of the RDRAM 18, 20 concurrently with one another. In one implementation this is achieved by combining a command interface 21 that supports receipt of pipelined refresh command sequences with an RDRAM core that includes logic for performing row operations (i.e., precharge and activate operations) on respective storage banks independently of one another. More specifically, by providing a plurality of row decoding circuits in the RDRAM device to allow word lines in respective banks to be asserted and deasserted independently of one another and also by providing logic to control the precharge voltages output by respective sense amplifier arrays independently of one another, it becomes possible to respond to the pipelined refresh commands by concurrently refreshing rows of memory cells in respective banks of an RDRAM 18, 20.

Figure 2:
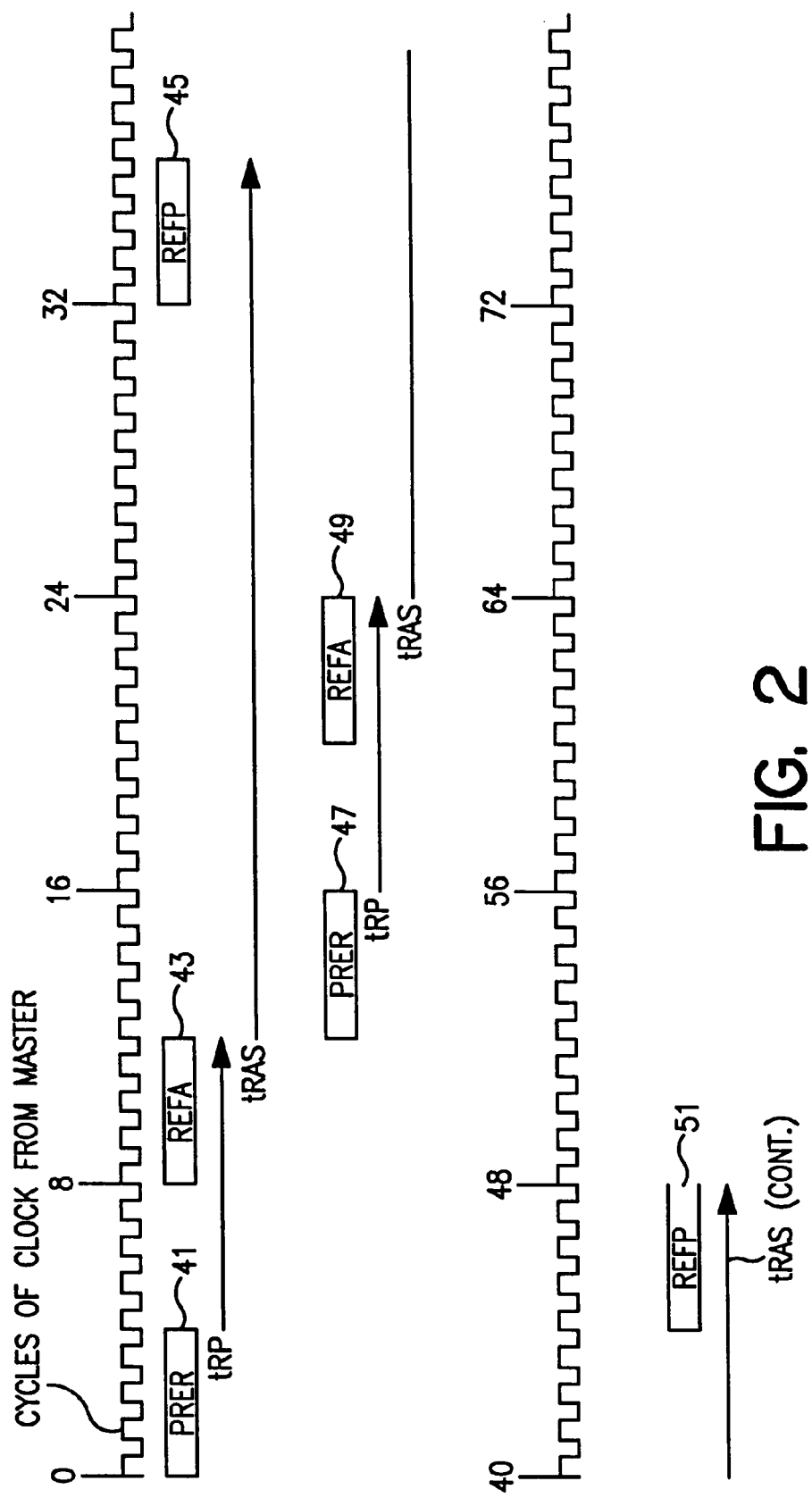
FIG. 2 is a timing diagram that illustrates transmission of primitive row commands to effectuate a pipelined refresh command sequence according to one embodiment.

FIG. 2 is a timing diagram that illustrates transmission of primitive row commands on a channel to effectuate a pipelined refresh command sequence. In one implementation, a refresh command sequence is composed of three primitive row commands each of which include a bank address to indicate the bank to be operated on. The primitive commands are PRER, a command to precharge the indicated bank; REFA, a command to activate a row in the indicated bank, the row being indicated by the RDRAM's internal refresh register (e.g., element 29 of FIG. 1); and REFP, a precharge-post-refresh command to precharge the addressed bank and, if the addressed bank is a predetermined bank number (e.g., the highest numbered bank in the RDRAM), to increment the row address in the RDRAM's internal refresh register.

Starting at clock cycle zero in FIG. 2, a memory controller initially issues a PRER command 41 to precharge a bank within an RDRAM. The precharge operation requires a time, tRP, to complete (eight clock cycles in this example). Time tRP after issuing the PRER command 41, the memory controller issues a REFA command 43 to activate a row within the RDRAM. As mentioned above, in one embodiment, the address of the bank to be refreshed is supplied in the REFA command 43 and the address of the row within the addressed bank is obtained from a row refresh register REFR in the RDRAM. The row activation operation requires a time, TRAS, which is relatively long (24 clock cycles in this example) because it involves sensing the relatively low level signals on the bitlines of the addressed bank. After a time tRAS has elapsed, the memory cells in the selected row have been refreshed and a precharge operation may be performed to close the bank. Thus, time tRAS after issuing the REFA command 43, memory controller issues a REFP command 45 to perform the precharge operation. When the precharge operation is completed tRP after receipt of the REFP command, the refresh operation is completed. As described above, if the bank address included in the REFP command 45 matches a predetermined address, the row address in the RDRAM row refresh register REFR is incremented.

Because the RDRAM includes logic for performing concurrent row operations in different banks and because the RDRAM command interface permits receipt of primitive row commands concurrently with performing a refresh operation in a first bank, a second refresh operation may be commanded and executed in a second bank concurrently with executing a previously commanded refresh operation in a first bank. Still referring to FIG. 2, a second PRER command 47 is transmitted on the channel just after the REFA command 43. By formatting the second PRER command 47 to address a different bank than the bank addressed in the three primitive commands that constitute the first refresh command sequence (i.e., commands 41, 43, 45), a new refresh command sequence is begun. A time tRP after issuing the second PRER command 47, a second REFA command 49 is issued to activate a row in the indicated bank. As shown in FIG. 2, the first and second refresh command sequences are issued concurrently and the resulting first and second refresh operations are performed concurrently. Because the PRER and REFA commands 47, 49 of the second refresh command sequence are transmitted during the interval between the REFA and REFP commands 43, 45 of the first refresh command sequence, there is no conflicting demand for channel access and therefore no additional delay incurred as a result of the command sequence transmissions. A time tRAS after the REFA command 49 is issued, a second REFP command 51 is issued to complete the second refresh operation.

Still referring to FIG. 2, it is not always necessary for the memory controller to issue a PRER command 41, 47 to start a refresh command sequence. As discussed above, the purpose of the PRER command is to close the indicated bank so that the bank is ready for the ensuing activate operation. In one embodiment, the memory controller tracks the state of each bank in the RDRAM device based on the sequence of commands that the memory controller issues. If the memory controller determines that the bank to be refreshed by a refresh command sequence (i.e., PRER, REFA, REFP) is already closed, the PRER command can be dropped, thus saving the tRP delay time and avoiding unnecessary channel utilization. Also, the RDRAM may be configured to automatically precharge a bank upon completion of a read/write operation on that bank. This is typically referred to as an auto-precharge mode. The memory controller may determine that an RDRAM or a bank within an RDRAM is configured for auto-precharge mode and therefore drop the PRER command from the refresh command sequence.

Figure 3:
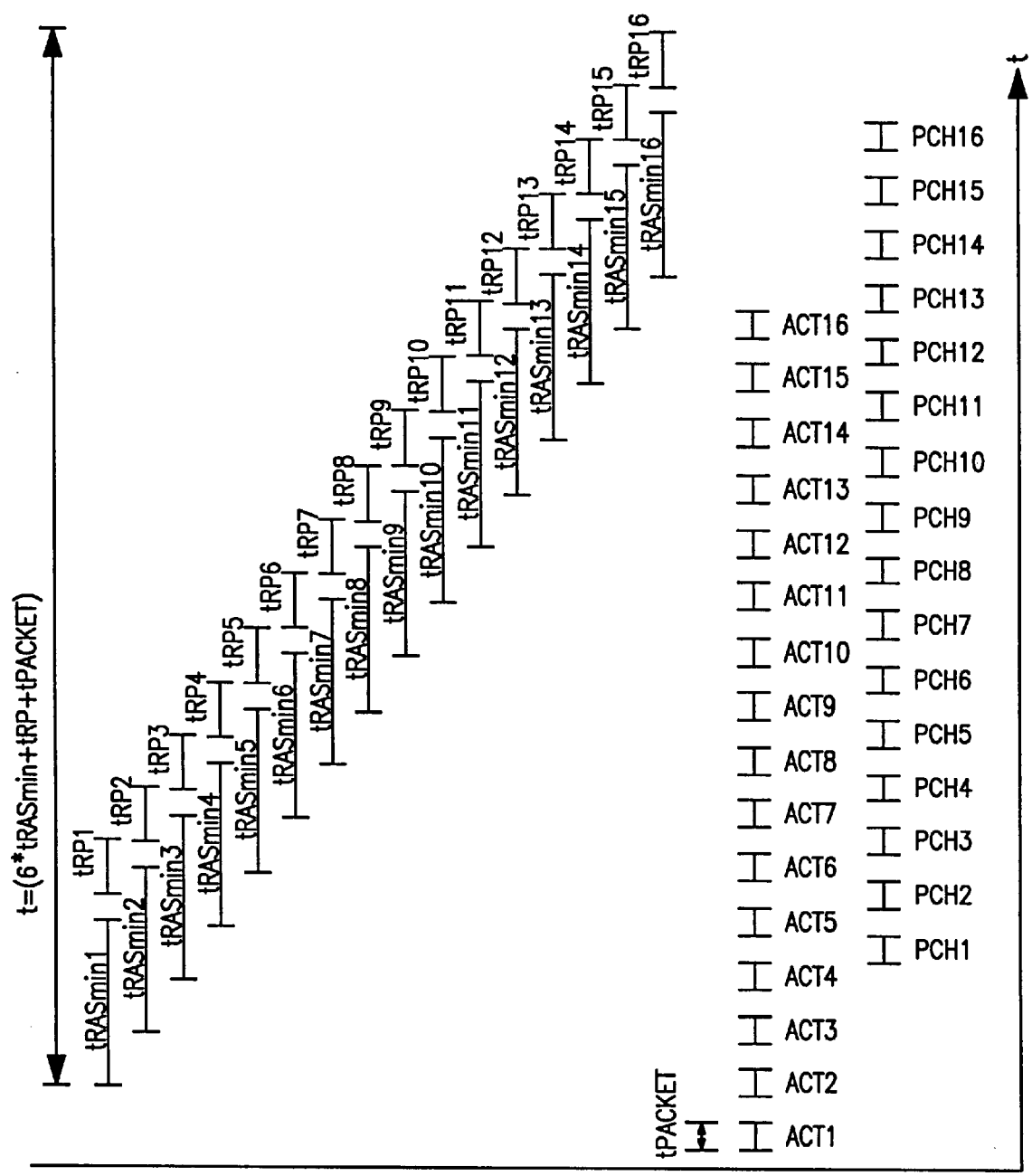
FIG. 3 is a timing diagram that illustrates the elapsed time required to perform sixteen refresh operations according to one embodiment.

FIG. 3 is a timing diagram that illustrates the reduction in elapsed time required to perform sixteen refresh operations according to one embodiment. In FIG. 3, it is assumed that the memory controller implements a closed page policy (i.e., an open bank is closed after each read/write transaction) so that the initial precharge command (PRER) can be dropped from each refresh command sequence. The first of 16 concurrently performed refresh operations is begun when an activate command ACT1 (e.g., a REFA command) is transmitted. As shown, a time tPACKET is required to transmit this command across the channel. In one embodiment, the command is transmitted during 4 cycles of a 400 MHz clock so that the command is transferred on the channel over a 10 nS interval. Shortly after the activate command is received in the RDRAM device, an activate operation is performed in the RDRAM core. The time interval over which this activate operation is performed is shown in FIG. 3 as tRASmin1. A typical activate operation requires approximately 60 nS. After the activate command ACT1 has been transmitted, a delay of approximately tPACKET occurs and then a second activate command ACT2 is transmitted on the channel. In response to activate command ACT2, a second row activate operation is performed in the RDRAM core concurrently with the first activate operation, but on a different bank. This second activate operation occurs over the time interval tRASmin2. Activate commands ACT3 and ACT4 are likewise sent to initiate third and fourth activate operations on respective banks of the RDRAM as indicated by time intervals tRASmin3 and tRASmin4. Just after the ACT4 command is issued and before a subsequent activate command ACT5 is issued, a precharge post-refresh command PCH1 (e.g., a REFP command) is transmitted on the channel. PCH1 is directed to the same bank as the ACT1 command and initiates a precharge operation to complete the refresh operation on that bank. A precharge operation typically requires approximately 20 nS as shown by time tRP1 in FIG. 3. After the PCH1 command is issued, activate commands ACT5, ACT6, . . . ACT16 and precharge commands PCH2, PCH3, . . . PCH13 are interleaved so that either an activate or a precharge command is being transmitted on the channel until during each cycle of channel availability until after PCH13 is issued. As a result, each of the refresh command sequences is pipelined on the channel and each refresh operation is performed concurrently with at least one other refresh operation. After PCH13, the final precharge commands PCH14, PCH15 and PCH16 are issued to complete the fourteenth, fifteenth and sixteenth refresh operations, respectively.

According to one embodiment, sixteen banks are provided in an RDRAM so that by issuing sixteen pipelined refresh command sequences as shown in FIG. 3, one row in each bank of the device is refreshed. By using the RDRAM's internal row refresh register REFR to indicate the row to be refreshed and by incrementing the internal row refresh register REFR in response to the final precharge post-refresh command PCH16, individual bursts of sixteen concurrent refresh operations can be used to update the RDRAM device on a row by row basis. As discussed above, by using the same internal row refresh register REFR to specify the address of the row to be refreshed whether in normal operating mode or in a reduced power mode, progression through the sequence of rows is maintained in proper order even through transitions into and out of a reduce power mode. As mentioned above, in at least one embodiment, the memory controller provides the address of the bank to be refreshed in the primitive row commands that make up a refresh command sequence. When a reduced power mode is entered, logic within the RDRAM device is used to increment the bank register REFB (e.g., element 30 of FIG. 1) that points to the bank to be refreshed after each internally initiated refresh operation. Because the memory controller may not be aware which bank was the last to be refreshed in a sequence, it may be necessary for the memory controller to repeat the refreshing of one or more banks by a burst of up to B bank refreshes, where B is the number of banks, when the RDRAM is transitioned from a power saving mode to a refresh mode. In an alternative embodiment of the present invention, the last bank to be refreshed may be read by the memory controller to determine the next bank to be refreshed.

Still referring to FIG. 3, another aspect of pipelining the refresh command sequences is that efficient use of channel bandwidth is achieved. Also, because of the concurrent refreshing of the different banks of the RDRAM, the tRASmin and tRP time intervals of the refresh operations are effectively hidden by one another. For example, if the refresh operation for each row in each bank was performed serially, the elapsed time to completely refresh the RDRAM would be approximately B*R*(tRASmin+tRP), where B is the number of banks in the device and R is the number of rows per bank. By issuing pipelined command sequences to effectuate the sixteen concurrent refresh operations illustrated in FIG. 3, however, the elapsed time to completely refresh the RDRAM would be approximately (B*R)*(6*tRASmin+tRP+tPACKET)/16.

It will be appreciated that the number of pipelined refreshes of a given refresh pipeline may be configured based on system design parameters. At one extreme, a burst of refresh command sequences may be issued without interruption to refresh each row in each bank of the RDRAM device. While this would reduce the time spent performing refresh operations as a proportion of device operating time, an increased read or write access latency would be incurred waiting for the long sequence of refresh operations to be completed. At the other extreme, only a small number of refresh command sequences (e.g., two) might be pipelined to reduce the read or write access latency, but with a less significant reduction in refresh overhead time. Any operation between these two extremes is considered to be within the scope of the present invention and a memory controller architecture that permits a variable number of pipelined refreshes is described below.

Simplifying RDRAM Control Logic Through the Use of Primitive Row Commands in the Refresh Command Sequence A significant advantage of using multiple primitive commands to effectuate a refresh operation in an RDRAM is that control logic within the RDRAM device can be simplified. One reason for this is that the timing of the constituent precharge, activate and precharge post refresh operations can be enforced by the memory controller instead of logic within the RDRAM device. That is, instead of issuing a single refresh command to an RDRAM device and requiring logic in the RDRAM device to time the primitive operations of precharge, activation and precharge post refresh (i.e., logic to enforce the tRP and tRASmin delays), the RDRAM can be configured to simply perform the precharge, activation and precharge post refresh operations when the corresponding commands are received. The timing of the primitive operations within the RDRAM is then determined by when the memory controller issues the PRER, REFA and REFP commands. That is, the memory controller may be configured to issue the PRER command, issue the REFA command tRP later than the PRER command, and then issue the REFP command tRASmin later than the REFA command. Requiring the memory controller to time issuance of these commands is not particularly onerous because the memory controller will usually need to time the overall refresh operation anyway so that it will know when the refresh operation has been completed. Moreover, the savings obtained by removing refresh timing logic from the RDRAM device is multiplied by the potentially large number of RDRAM devices in a memory subsystem. This is a significant advantage achieved by decomposing a unitary refresh command into primitive commands that correspond to the elementary operations used to refresh a row of memory cells.

Over view Of A Memory Controller According to One Embodiment

Figure 4:
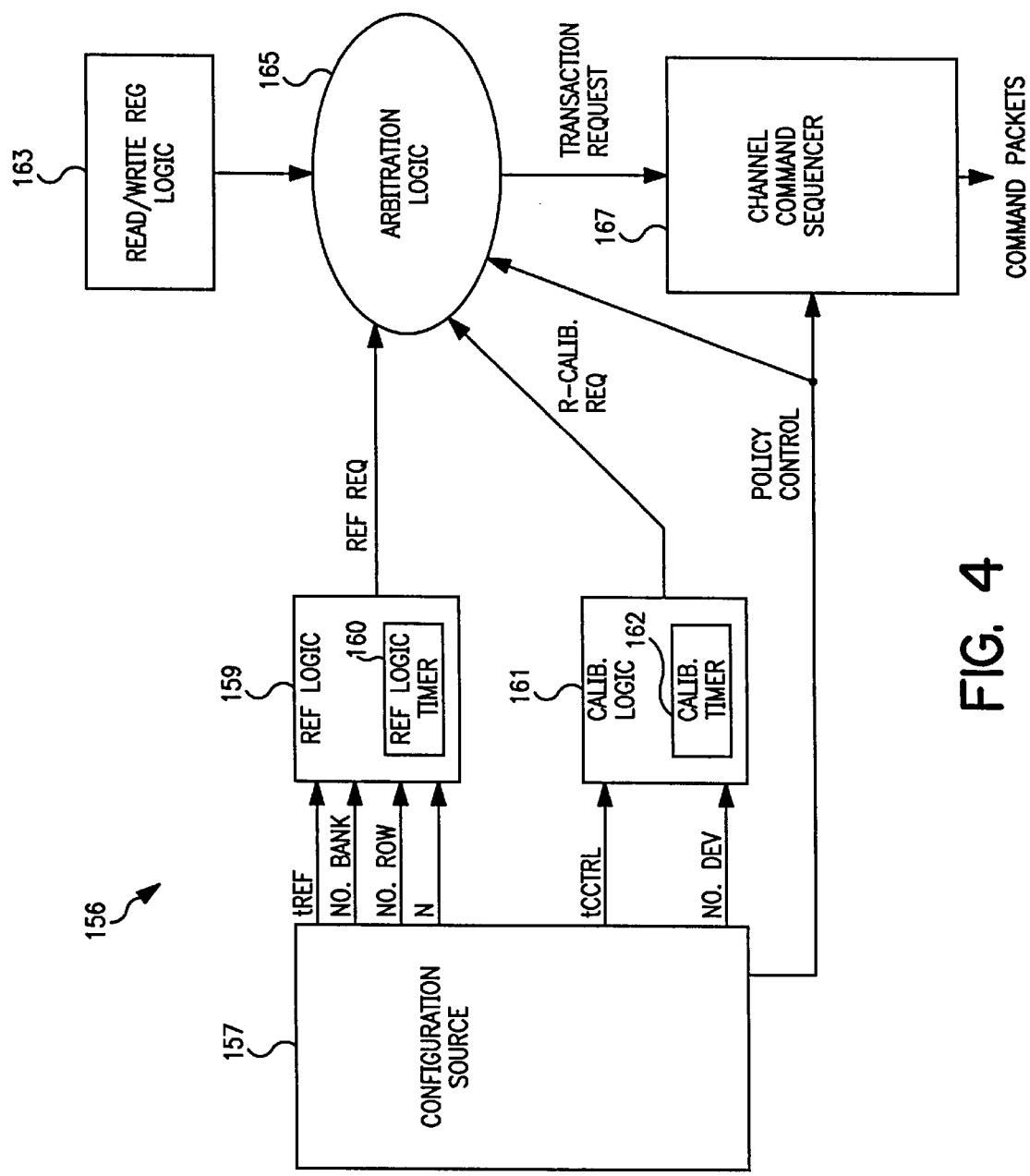
FIG. 4 is a block diagram of a memory controller for issuing pipelined refresh command sequences according to one embodiment.

FIG. 4 is a block diagram of a memory controller 156 for issuing pipelined refresh command sequences according to one embodiment. The memory controller 156 includes a configuration storage 157, arbitration logic 165, read/write request logic 163, refresh logic 159, calibration logic 161 and a channel command sequencer 167. In one embodiment, the refresh logic 159 includes a refresh timer 160 and the calibration logic 161 includes a calibration timer 162.

In one implementation, memory configuration parameters are written to the configuration storage 157 during system initialization. The configuration parameters include, the number of RDRAM devices in the memory subsystem, the number of storage banks per RDRAM, the number of rows of memory cells per bank, the time interval within which each row of an RDRAM must be refreshed (tREF) and the interval within which each RSL signaling circuit must be calibrated (tCCTRL). The configuration storage 157 may also be programmed with policy control parameters that are used to prioritize requests received in the channel command sequencer 167 and in the arbitration logic 165.

In one embodiment, the arbitration logic 165 receives requests to issue commands to RDRAM devices from the read/write request logic 163, the refresh logic 159 and the calibration logic 161. The arbitration logic 165 selects from among these competing requests based on the policy control parameters received from the configuration storage 157 and forwards a prioritized stream of transaction requests to the channel command sequencer 167. In one embodiment the channel command sequencer 167 is a state machine that generates and outputs command packets on the channel according to the stream of transaction requests from the arbitration logic and based on policy control parameters received from the configuration storage 157. As discussed below, in one implementation the channel includes separate command ports for issuing different types of command packets. In one embodiment, the channel command sequencer 167 may reorder the transaction requests received from the arbitration logic 165 to increase the concurrency of command packets sent on the two command ports.

In one implementation the refresh logic 159 issues a request to perform a multi-bank refresh each time the refresh timer 160 expires. Each multi-bank refresh request causes the channel command sequencer 167 to issue a pipelined set of N refresh command sequences, with each command sequence being broadcast to each RDRAM on the channel. The value N may be hard wired or it may be determined based on a parameter supplied to the refresh logic from the configuration storage. In one embodiment, for example, the parameter is equal to the number of banks per RDRAM so that each refresh request causes the channel command sequencer 167 to issue a pipelined set of refresh command sequences directed to each of the respective banks of each RDRAM. For example, in a sixteen bank device, a pipelined set of sixteen refresh command sequences as shown in FIG. 3 is issued when the refresh timer 160 times out. The refresh timer 160 is programmed to have a timeout interval equal to (tREF * N)/(number of banks * number of rows) so that each row in each RDRAM device is refreshed within the tREF interval.

The calibration logic 161 issues a calibration request in response to timeout of the calibration timer. As discussed below, the RDRAM devices are calibrated independently of one another so that the calibration timer 162 is programmed to timeout after every time interval tCCTL/number of RDRAM devices. As discussed below, each calibration request typically results in multiple commands being issued by the channel command sequencer 167. In one embodiment, the channel command sequencer may abort issuance of a sequence of calibration-related commands in response to a higher priority read or write request. This design reduces the read/write access latency caused by signal calibration operations.

Figure 5:
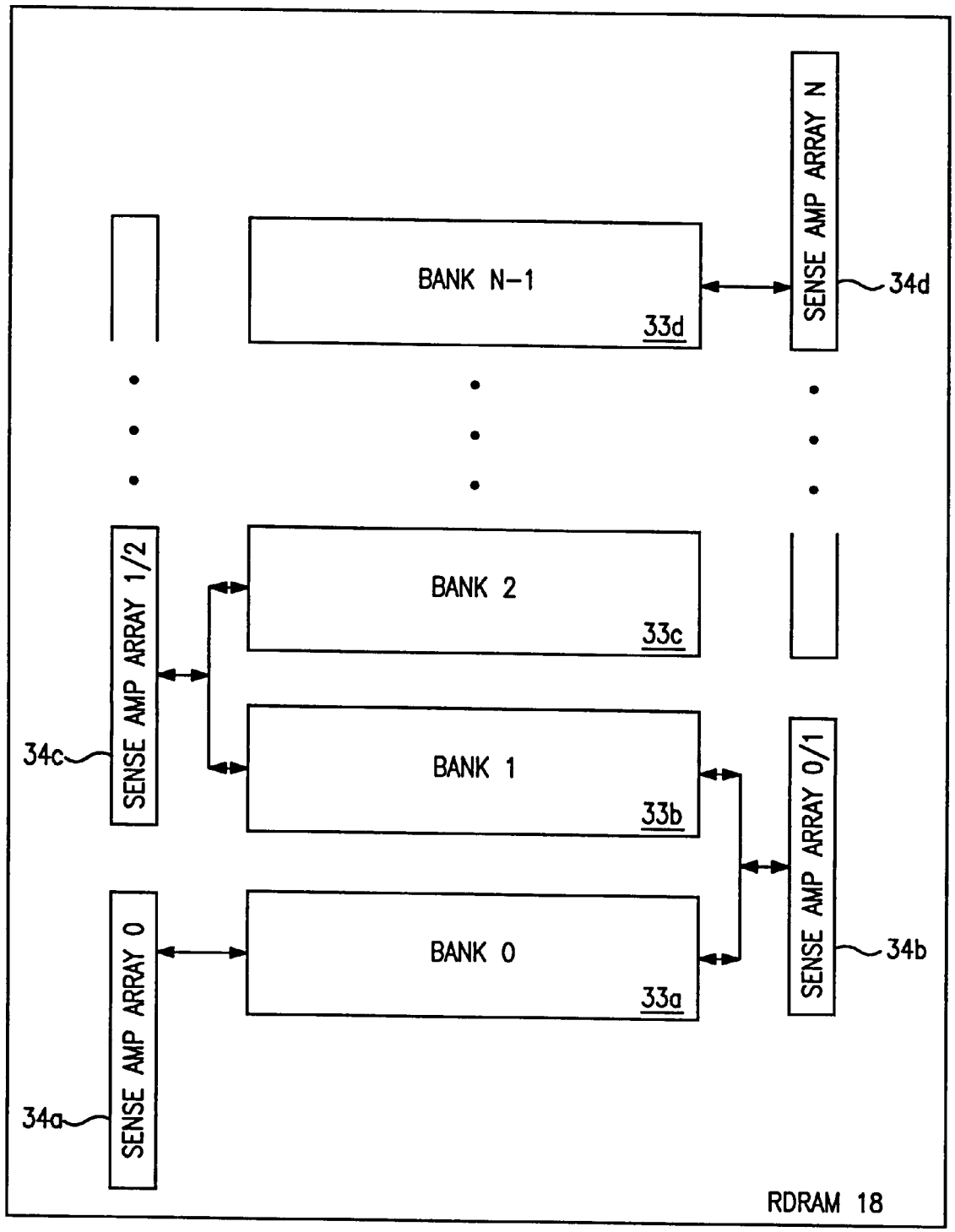
FIG. 5 illustrates the arrangement of storage banks and sense amplifier arrays in an RDRAM device according to one embodiment.

Performing Concurrent Refresh Operations In An RDRAM That Includes Dependent Banks FIG. 5 illustrates the arrangement of N storage banks 33a, 33b, 33c, 33d and N+1 sense amplifier arrays 34a, 34b, 34c, 34d in an RDRAM device 18 according to one embodiment. Using a design technique referred to as "bank doubling", each of the N storage banks 33a, 33b, 33c, 33d shares at least one of the sense amplifier arrays 34a, 34b, 34c, 34d with another bank. The idea behind bank-doubling is to reduce the number of die-consuming sense amplifiers in the DRAM device to provide room for more storage banks. By halving the number of sense amplifiers in each sense amplifier array 34a, 34b, 34c, 34d and then coupling two such half-sized sense amplifiers arrays 34a, 34b, 34c, 34d to each storage bank 33a, 33b, 33c, 33d, it becomes possible to sense data in N storage banks using N+1 half-sized sense amplifier arrays. (This represents a nearly 2:1 increase in the ratio of storage banks to sense amplifiers—hence the expression, bank doubling.) Referring to bank 1 (33b) for example, when a row is activated in bank 1 (33b), sense amplifer array 0/1 (34b) and sense amplifer array 1/2 (34c) each sense the data from a respective half of the activated row so that, in combination, the half-sized sense amplifier arrays 0/1 and 1/2 (34b, 34c) provide a full sense amplifier array for the activated row in bank 1 (33b). In one embodiment, banks at extreme die positions relative to other banks (e.g., bank zero 33a and bank N-1 33d in FIG. 5) each have one dedicated half-sized sense amplifier array (sense amplifier arrays zero 34a and N 34d, respectively).

One consequence of the bank doubling design is that the availability of a given bank is dependent upon whether the bank's sense amplifier arrays are in use by another bank. Two banks which share a sense amplifier array are therefore said to be dependent banks and may not be open at the same time. From the viewpoint of RDRAM refresh operations, this means that concurrent refresh operations should be prevented from being initiated in dependent banks. In one embodiment this is accomplished by configuring the memory controller to address banks for concurrent refresh according to a bank selection sequence that prevents row operations from being concurrently performed on dependent banks. For example, in a device that contains 16 banks (numbered 1–16), the memory controller may be configured to increment the address of the bank selected for each successive refresh operation as follows: Next Bank=(Present Bank+5) modulo 16. This results in the following bank selection sequences: 1, 6, 11, 16, 5, 10, 15, 4, 9, 14, 3, 8, 13, 2, 7, 12, 1, 6, and so forth. In the embodiment of FIG. 5, this means that, after beginning refresh of a given bank, at least two non-dependent banks will be refreshed before a dependent bank is refreshed. It will be appreciated that other bank selection sequences may be used without departing from the spirit and scope of the present invention.

Figure 6:
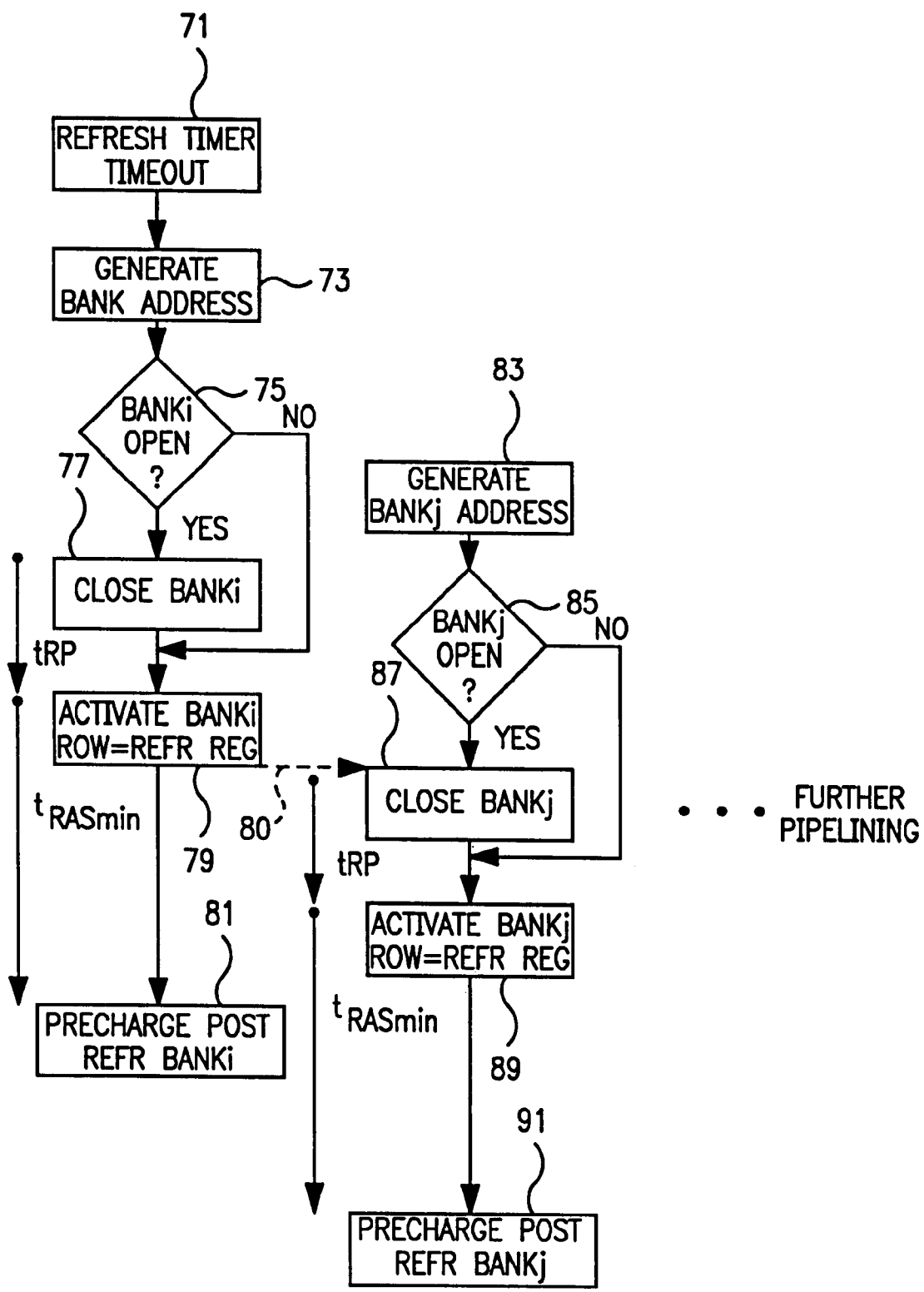
FIG. 6 is a flow diagram of memory controller sequencing logic according to one embodiment.

FIG. 6 is a flow diagram of memory controller logic according to an embodiment that supports issuance of overlapping refresh command sequences even if the target RDRAM device includes dependent banks. Initially, in block 71, a timer (e.g., element 160 of FIG. 4) within the memory controller times out to indicate that it is time to perform a refresh operation. At block 73 the address of the next bank to be refreshed, bank$_i$, is generated. In one embodiment, the bank address is calculated by adding or subtracting a value from the previously calculated address using modulo arithmetic. In an alternate embodiment, the bank address may be obtained from a bank address lookup table in which a bank selection sequence has been stored, for example, during system initialization after a start-up procedure has determined the configuration of the RDRAM components in the memory subsystem.

At decision block 75 the memory controller determines whether bank$_i$ is open and, if so, the memory controller issues a precharge command (e.g., PRER) to close bank$_i$ at block 77. If bank$_i$ is not open, then block 77 is skipped and an activate command (e.g., REFA) is issued at block 79. As discussed above, in one embodiment the activate command includes a bank address, but not a row address. Instead the row address is obtained from the row refresh register REFR within the RDRAM device being refreshed. Note that if bank$_i$ had been open, then after issuing the precharge command at block 77 the memory controller delays for a time tRP before issuing the activate command at block 79.

After issuing the refresh command at block 79, the memory controller delays for a time tRASmin before issuing a precharge post refresh command (e.g., REFP) at block 81. As mentioned above, the precharge post refresh command is similar to the precharge command except that it causes the row address within the RDRAM's internal row refresh register REFR to be incremented when the bank address is a predetermined value.

Still referring to FIG. 6, a second refresh command sequence is issued by the memory controller concurrently with the first refresh command sequence. Beginning at block 83, a new bank address, bank$_j$, is generated. In one embodiment, the memory controller specifically selects bank$_j$ (either through calculation or table look-up) because it is not dependent on bank$_i$. At block 85, the memory controller determines whether bank$_j$ is open and, if so, issues a precharge command to close the bank at step 87. At block 89, an activate command is issued to bank$_j$. As indicated by arrow 80 in FIG. 6, because the precharge and activate commands addressed to bank$_j$ are issued after the activate command addressed to bank$_i$ and before issuance of the precharge post refresh command addressed to bank$_i$, the precharge and sense commands addressed to bank$_j$ are transmitted on the channel concurrently with the activation of bank$_i$. As discussed above, because the command interface of the RDRAM device is designed to receive commands directed to one bank concurrently with an ongoing refresh operation in another bank, and because the RDRAM includes logic to allow concurrent row operations to be performed on respective banks, refresh operations can be concurrently performed on respective banks.

Calibration of Rambus Signaling Logic

Figure 7A:
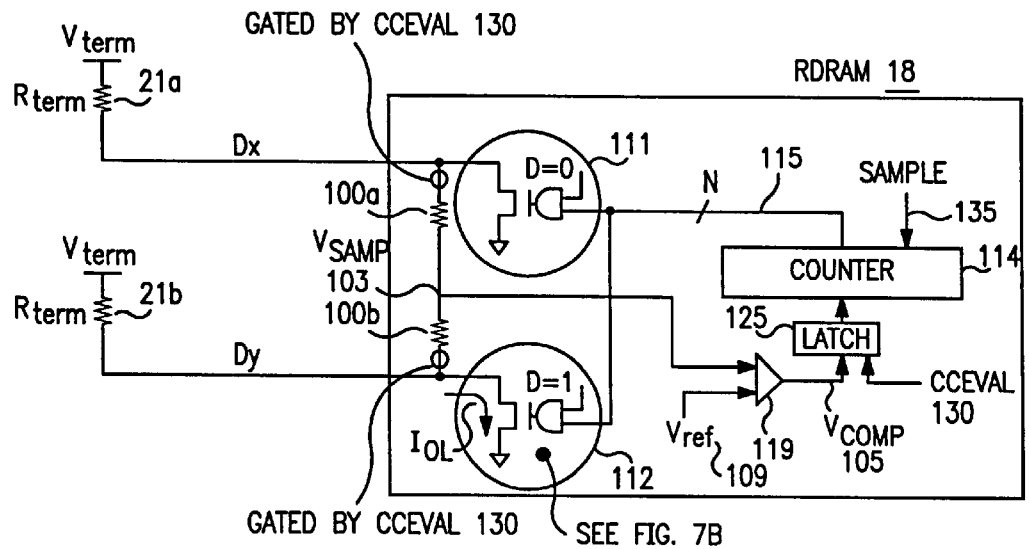
FIG. 7 depicts a circuit that can be used to adjust the signaling strength of RSL signaling circuits in an RDRAM.
Figure 7B:
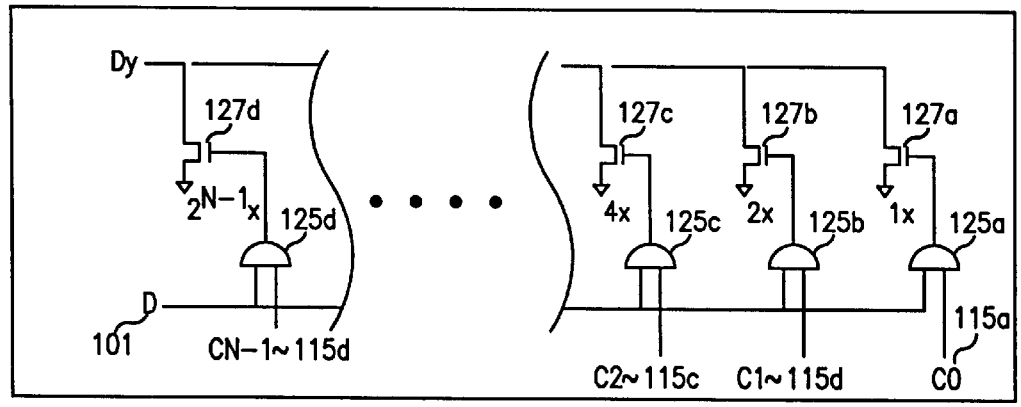

FIG. 7 depicts a circuit 108 that can be used to adjust the signaling strength of RSL signaling circuits in an RDRAM device 18. The circuit 108 consists of a pair of resistors 100a, 100b coupled via switches 120 and 121 to form a voltage divider between the outputs Dx, Dy of two RSL signaling circuits 111, 112. Switches 120, 121 are used so that the resistors 100a and 100b can be disconnected connected from the RSL signaling circuits 111 and 112 during normal operation. The midpoint of the voltage divider, Vsamp 103, is coupled to one input of a comparator 119 and the other input of the comparator 119 is coupled to the reference voltage, Vref 109. In one embodiment, Vref 109 is supplied to the RDRAM device 18 from an external source and Von (discussed above) is set so that the output signal on either Dx or Dy swings symmetrically about Vref 109. In an alternate embodiment, Vref 109 may be generated within the RDRAM device 18. In yet another embodiment, Von may be set so that the output signal does not swing symmetrically about Vref.

Still referring to FIG. 7, the comparator 119 output Vcomp 105 is coupled to latch circuitry 125 whose output is coupled to an up/down input of a counter 114. The counter 114 samples its up/down input in response to a sample signal 135 and increments or decrements an internally stored count value accordingly. In one embodiment, the count value is output as an N-bit biasing signal 115 that is supplied to each of the RSL signal driving circuits on the RDRAM device. In one implementation, the respective bits of the biasing signal 115 (i.e., bits $C_0, C_1, C_2, C_{N-1}$) are gated by a data signal 101 at gates 125a, 125b, 125c, 125d and then applied to the respective control inputs of a set of transistors 127a, 127b, 127c, 127d. Each of the transistors 127a, 127b, 127c, 127d is weighted to sink approximately twice as much current as a less significant one of the transistors 127a, 127b, 127c, 127d. Using the count value to bias the transistor bank of an RSL signaling circuit in this way, up to $2^N-1$ different values of on-current ($I_{OL}$) may be obtained in approximately equal steps. As the count value in the counter 114 is adjusted up or down, the impedance of the RSL signaling circuit 112, is adjusted to enable a lower or higher on-current to flow on the signal path of the channel. In one embodiment, the biasing signal 115 output from the counter 114 is applied to each signal driving circuit on the RDRAM 18 so that all RSL signaling circuits are adjusted at the same time and by the same amount. In alternate embodiments, multiple counters may be used to allow adjustment of smaller groups of RSL signaling circuits or even to allow individual adjustment of each RSL signaling circuit.

According to one embodiment, the biasing signal 115 (i.e., the count value) used to control the on-current of an RSL signaling circuit is adjusted by first turning off the signaling circuit 111 and turning on the signaling circuit 112. Also, switches 120 and 121 are turned on to couple the voltage dividing resistors 100a, 100b across the two signaling circuits 111 and 112. This causes current to flow from Vterm through resistor Rterm 21a on the Dx signal path, through the voltage dividing resistors 100a, 100b and finally through the signaling circuit 112. In one embodiment, the goal of a current calibration operation is to adjust the impedance presented by the signaling circuit 112 to the point at which the voltage Vsamp 103 is approximately equal to Vref 109. Assuming for example that Vsamp 103 is initially above Vref 109, the comparator will output a high Vcomp which, when the output of the comparator is latched in latch 125 by deassertion of the CCEVAL signal 130 and assertion of the SAMPLE signal 135, will cause the counter 114 to increment its count value. The increased count value will be transmitted to the signaling circuit 112 via the biasing signal 115. The increased biasing signal 115 will reduce the impedance of the signaling circuit 112 and thereby increase $I_{OL}$. The reduced impedance of the signaling circuit 112 will also cause Vsamp 103 to be reduced. If Vsamp 103 drops below Vref 109, the comparator 119 will output a low-valued Vcomp 105. The low Vcomp 105 will cause the counter 114 to decrement the count value when the output of the comparator is latched in latch 125 by the deassertion of the CCEVAL signal 130 and assertion of the SAMPLE signal 135. Decrementing the counter 114 will reduce the biasing signal 115 and therefore increase the impedance presented by signaling circuit 112 so that $I_{OL}$ is decreased and Vsamp 103 is increased.

When calibrating RSL signaling circuits it is usually necessary to block other transactions on the Rambus Channel to prevent interference with calibration signals on the Dx and Dy signal paths. Although the time required to perform a signal calibration operation is usually short (e.g., a few dozen nanoseconds or less) it must still be accounted for in determining a worst case read or write latency.

According to one embodiment, the impact on read/write latency caused by signal calibration operations is reduced by resolving the single calibrate-and-sample command that had been used in prior systems into two more primitive types of commands. A first command type, called a calibrate command, is issued to the RDRAM device 18 to cause the device to begin a current adjustment operation by engaging switches 120, 121, turning off the signaling circuit 111 and turning on the signaling circuit 112, as described above. This is referred to as enabling the calibration circuitry and is associated with the on-state of the signal CCEVAL 130. While the RDRAM device continues to receive calibrate commands from the memory controller, the calibration circuitry remains enabled and the calibration circuitry is disabled when a non-calibrate command is received. When the calibration circuitry is disabled, the states of the signaling circuits 111, 112 are no longer forced so that normal data transport operations can take place on the channel. In effect, calibrate commands act as keep alive signals to maintain the calibration circuitry in the enabled condition. So long as calibrate commands continue to be received in the RDRAM device 18, the calibration circuitry remains enabled.

In one embodiment, after approximately three calibrate commands have been issued to enable the calibration circuitry and to allow the output Vcomp 105 of the comparator 119 to become stable, the memory controller issues a second type of primitive command called a calibrate/sample command. The calibrate/sample command causes two phases of operation to occur in the circuit 108: a calibrate phase during which assertion of the CCEVAL signal 130 is maintained, and a sample phase during which the CCEVAL signal 130 is deasserted to latch the state of Vcomp 105 in latch 125 and the SAMPLE signal 135 is asserted to adjust the count value in counter 114 up or down based on the latched state of Vcomp output by latch 125. According to one embodiment, a memory controller is configured at system initialization time to issue a predetermined number of calibrate commands in each signal calibration operation before issuing a sample command. The predetermined number of calibrate commands may be empirically determined based on, for example, the time required for $I_{OL}$ to settle and the time required for the comparator 119 to output a steady Vcomp 105 after $I_{OL}$ has settled. In one embodiment, after the predetermined number of calibrate commands have been issued, the memory controller issues the calibrate/sample command to disable the calibration signal and to assert the SAMPLE signal 135 so that the count value is incremented or decremented based on Vcomp 105. After the sample command has been issued and the count value has been adjusted the calibration operation is completed.

Because temperature change and steady-state voltage drift (e.g., drift in Vterm) are relatively slow phenomena, performing a calibration operation once every hundred milliseconds or so in each RDRAM device is usually sufficient to track any environmental changes. It will be appreciated that at system initialization, it may be necessary to issue several calibrate-calibrate/sample command sequences in succession to make a relatively large initial adjustment to the signaling circuit drive strength.

As mentioned above, in prior RDRAM devices a single command was issued by the memory controller to perform a calibration operation. One advantage of resolving the single command into the more primitive calibration command types (i.e., calibrate commands and calibrate/sample commands), is that it becomes possible to interrupt a calibration operation during the sequence of calibrate commands to perform a higher priority operation such as a read or write. This reduces the worst case read/write latency because a requested read or write need not be delayed while a calibration operation is completed. For example, if a request to perform a high priority read operation is received after a calibrate command has been issued, the memory controller may issue the read request instead of continuing with the calibrate and calibrate/sample command sequence. As discussed below, the read request is issued on a dedicated command path and therefore may be issued directly after a calibrate command without any adverse effects. The calibration circuitry simply disables itself and no adjustment to the value in the up/down counter 114 is made. The RSL signaling circuits are then available to drive the data retrieved in response to the read command onto the data portion of the channel. Also, because no sample command is issued (it has been superseded by the read command), the biasing signal 115 remains unchanged. Thus, by resolving a single signal adjustment command into different primitive command types, a signal calibration operation may be interrupted to service higher priority requests without compromising the calibration setting of the RSL signaling circuits.

RSL signaling circuits are also included in the Rambus ASIC Cell (e.g., FIG. 1, element 14) in memory controller. These RSL signaling circuits can be calibrated using the circuit shown in FIG. 7. According to one embodiment, the signal paths across which the voltage dividing resistors (e.g., elements 100a, 100b of FIG. 7) are coupled are different for the Rambus ASIC Cell than for the RDRAM devices so that the RSL signaling circuits in the Rambus ASIC Cell may be calibrated concurrently with calibration of RSL signaling circuits in a RDRAM device without conflict.

Increasing Channel And RDRAM Availability By Performing Concurrent Refresh And Signal Calibration Operations According to one embodiment, channel and RDRAM availability are increased by concurrently commanding and performing refresh and calibration operations. One way that this is accomplished is by providing distinct command ports on the channel to allow the primitive row commands used to perform refresh operations to be received on one command port at the same time that primitive calibration commands are received on another command port.

Figure 8:
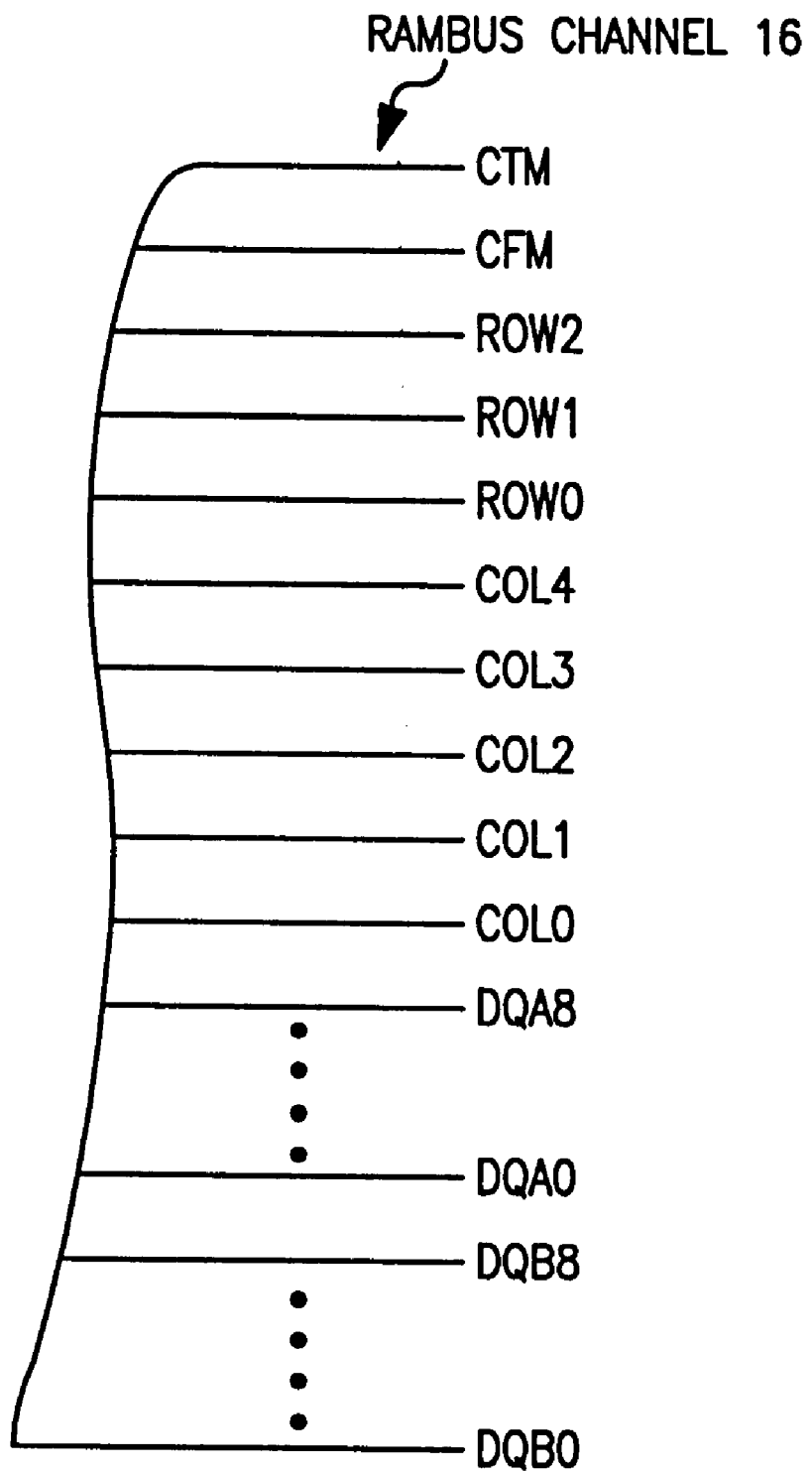
FIG. 8 illustrates a number of the signal paths present on one embodiment of a channel.

FIG. 8 illustrates a number of the signal paths present on one embodiment of a channel. The DQA0–DQA8 signals and the DQB0–DQB8 signals are used to transfer data to and from the RDRAM devices coupled to the channel and are driven in the outgoing direction by the RSL signaling circuits described above. In one embodiment, the Row0–Row2 and the Co10–Co14 signal paths are used to carry command packets from the memory controller to the RDRAM devices. The CTM and CFM are the clock-to-master and clock-from-master signals, respectively, and are used to provide the bus cycle timing for transfer of command packets and data packets on the channel.

According to one embodiment, the Row0–Row2 and Co10–Co14 signal paths are used to provide respective row and column command ports on the channel. A first category of command packets, called row command packets, are transmitted on the row command port and a second category of command packets, called column command packets, are transmitted on the column command port. As mentioned above, providing two discrete command ports makes it possible to issue refresh related commands on one command port concurrently with issuing calibration related commands on the other command port. Because refresh operations do not result in transfer of data via RSL signaling circuits in the RDRAM, and because current calibration operations do not require access to storage banks within the RDRAM, these operations may be performed concurrently to reduce the RDRAM unavailability due to refresh and current calibration. In effect, the time required to perform current calibration operations may be hidden in the refresh operations.

Figure 9:
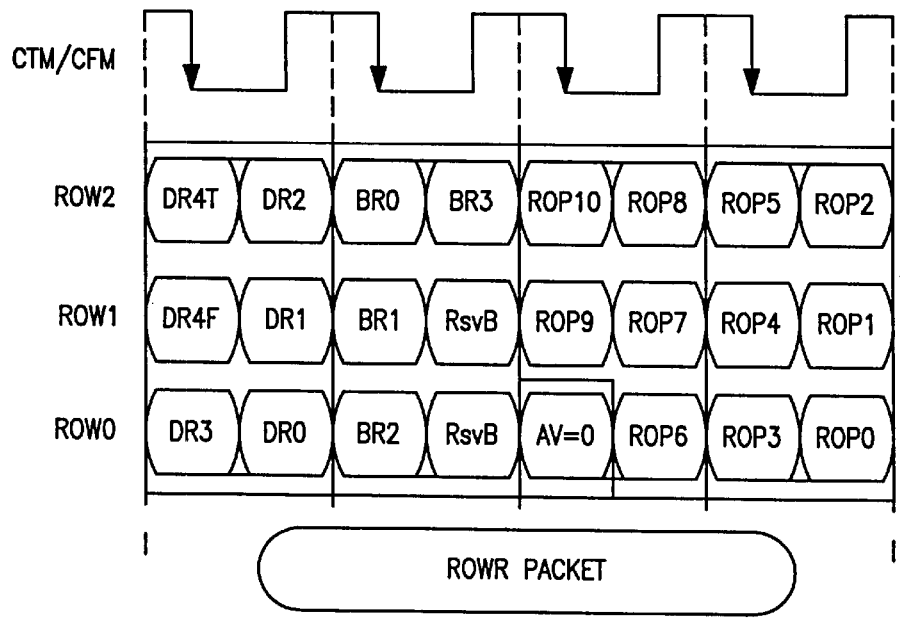
FIG. 9 is a diagram of a row command packet, RowR, according to one embodiment.

FIG. 9 is a diagram of a row command packet, RowR, according to one embodiment. The RowR packet is used to issue various commands including the primitive row commands PRER, REFA and REFP used to perform refresh operations. As shown in FIG. 9, the packet is transmitted on the Row0–Row2 signal paths of the channel, with a respective group of three bits being transferred in response to each of eight successive transitions of a clock signal (e.g., clock from master, CFM). Thus, the RowR packet includes twenty-four bits in all. According to one embodiment, the DR4T and DR4F bits of the RowR packet are used to indicate whether the command packet is being broadcast to all RDRAM devices on the Rambus channel (32, with five bits specifying the device), or only to those devices whose low order device ID bits match bits DR0–DR3 of the RowR packet (further decoding of the DR4T and DR4F fields are used to provide an additional device ID bit). This permits row commands, including the primitive commands for performing refresh operations to be broadcast to all of the RDRAM devices on the channel at once or, alternatively, to a selected RDRAM. The BR0–BR3 bits are the bank address and specify one of sixteen banks to which the RowR command is addressed. The bits marked RsvB are reserved for other purposes. The AV bit is used to indicate whether the command packet is to be interpreted by the RDRAM command interface as a RowR command packet or another type of row command packet. In this case AV is set to zero to indicate a RowR packet. The bits ROP0–ROP10 constitute an eleven bit row opcode. According to one embodiment, respective row opcodes are used to indicate the precharge (PRER), activate (REFA) and precharge post refresh (REFP) commands, among others.

Figure 10:
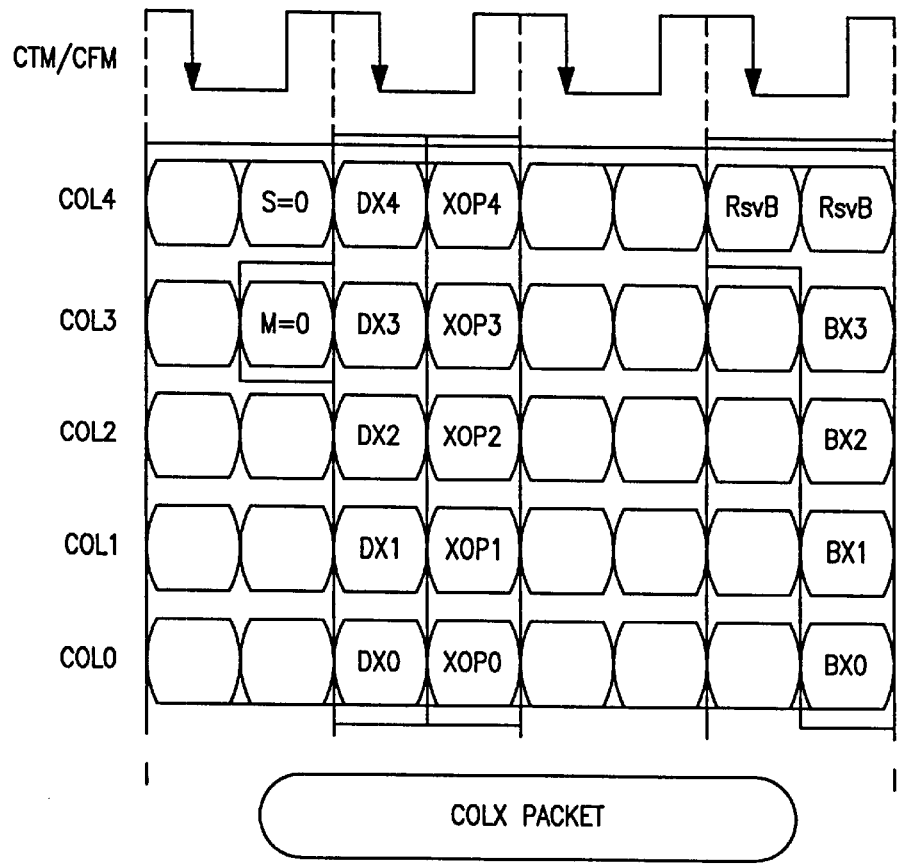
FIG. 10 is a diagram of a column command packet, ColX, according to one embodiment.

FIG. 10 is a diagram of a column command packet according to one embodiment that can be used to issue calibrate and sample commands. The column command packet is transmitted on the Co10–Co14 signal paths of the channel, with a respective group of five bits being transferred in response to each of eight successive transitions of a clock signal (e.g., clock from master, CFM). Thus, a column command packet includes forty bits in all. The S bit and the M bit are used to indicate the type of column command packet. In this case, the S bit and the M bit are both set to zero to indicate a column command packet referred to as a ColX packet. In the ColX packet, the blank bits are reserved and the bits marked DX0–DX4 are used to provide a five bit device ID. According to one embodiment, at least thirty-two RDRAM devices may be coupled to the channel (or extensions thereof) and programmed with one of thirty-two different identifiers. The five bit device ID indicated by bits DX0–DX4 is compared to the identifier stored in a given RDRAM to determine whether the packet is addressed to that RDRAM. If so, a five-bit opcode in the XOP0–XOP4 bits is decoded to determine the command. The command may be a calibrate command (CAL) or a sample command (SAM), among others. The RsvB bits and the unmarked bit positions are reserved for other purposes and the BX0–BX3 bits are used to provide a bank address. In one embodiment, the bank address is ignored in the calibrate and sample commands.

Figure 11:
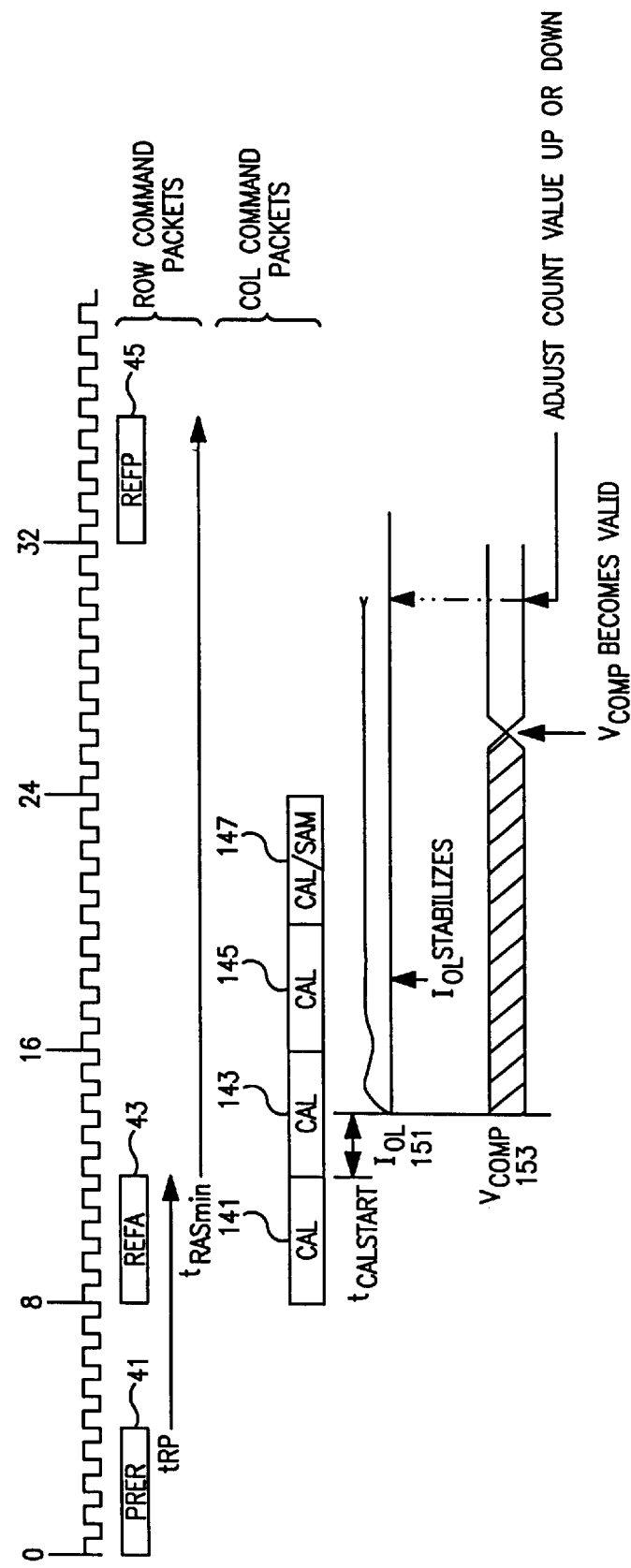
FIG. 11 is a timing diagram illustrating concurrent refresh and signal calibration operations according to one embodiment.

FIG. 11 is a timing diagram illustrating concurrent refresh and signal calibration operations. A refresh command sequence including PRER, REFA and REFP commands 41, 43, 45 is transmitted in three RowR packets on the row command port of the channel. The timing of this command sequence and the resulting refresh operation is described in reference to FIG. 2. An exemplary signal calibration command sequence including three back-to-back CAL commands 141, 143, 145 followed by a CAL/SAM command 147 is also shown. An initial CAL command is issued during the same four bus cycles as the REFA command. As discussed above, this is made possible by the partitioning of the channel command path into distinct row and column command ports. Thus, a REFA command 43 is transmitted in a RowR packet on the row command port during the same time that a CAL command 141 is transmitted in a ColX packet on the column command port.

During the time tRASmin that an activate operation is performed on the row being refreshed within the RDRAM core, the RSL calibration circuitry in the RDRAM is enabled so that a time tCALSTART after receipt of the first CAL command, current $I_{OL}$ begins to ramp through the enabled signaling circuit (see element 112 of FIG. 7). A second CAL command 143 is received after the first CAL command 141 so that the RSL calibration circuitry remains enabled. $I_{OL}$ begins to stabilize at the time shown in FIG. 11. A third CAL command 145 is received after the second CAL command 143 so that the RSL calibration circuitry remains enabled until Vcomp becomes valid. Recall that Vcomp is the output of the comparator (element 119 of FIG. 5) and is used to control whether the biasing signal to the RSL signaling circuits is adjusted up or down by a CAL/SAM command. A CAL/SAM command 147 is issued after the third CAL command 145 to disable the calibration circuit, latch the comparator value and assert the SAMPLE signal to the counter (see FIG. 5, element 114 and signal 117) and to adjust the count value up or down according to the latched Vcomp value. Thus, a signal calibration operation is completed concurrently with the refresh operation. It will be appreciated that the signal calibration operation may also be performed concurrently with multiple refresh operations to respective RDRAM banks, the multiple refresh operations also being performed concurrently with one another.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of refreshing a memory device having a dynamic memory array with at least two banks, each bank including a plurality of rows of memory cells, the method comprising:

the memory device receiving an activate request identifying a bank in which a row is to be activated, the row to be activated in the identified bank being specified by a row register in the memory device;

the memory device performing the activate operation on the row in the identified bank in response to the activate request;

the memory device receiving a precharge request specifying the bank identified in the activate request, the precharge request being received concurrently with the activate operation on the row in the identified bank; and the memory device performing the precharge operation on the identified bank in response to the precharge request after performing the activate operation.

2. A method of refreshing memory cells in a memory device that includes a plurality of memory banks, each bank including a plurality of rows of memory cells, the method comprising:

receiving in the memory device a first refresh command that identifies a first bank of the plurality of banks;

refreshing a first row of the plurality of rows of memory cells in the first bank, the first row being specified by a row refresh register in the memory device; and automatically modifying the value in the row refresh register, after receiving the first refresh command, when the first bank, identified by the first refresh command, is equal to a predetermined bank of the plurality of banks.

3. The method of claim 2 wherein modifying the value in the row register comprises incrementing the value in the row refresh register.

4. The method of claim 2 further comprising receiving in the memory device a second refresh command that identifies a second bank of the plurality of banks before refreshing the first row is completed.

5. The method of claim 2 further comprising:

transitioning the memory device to a power-saving state; and automatically refreshing rows of memory cells in the banks other than the first bank in response to transitioning to the power-saving state, the rows of memory cells in banks other than the first bank being specified by the row refresh register.

6. The method of claim 2 wherein refreshing the first row comprises activating the first row.

7. The method of claim 6 further comprising:

receiving a precharge command in the memory device; and precharging the first row in response to the precharge command.

8. The method of claim 7 including:

comparing a bank address included in the precharge command against a predetermined bank address; and incrementing a value in the row refresh register if the bank address matches the predetermined bank address.

9. A memory device comprising:

a plurality of memory banks each including a plurality of rows of memory cells;

a command interface to receive a first refresh command that identifies a first bank of the plurality of banks;

a row refresh register to store a value that identifies a first row of the plurality of rows of memory cells; and control circuitry coupled to the command interface, the row refresh register and the plurality of memory banks, the control circuitry being configured to refresh the first row in the first bank in response to receipt of the first refresh command in the command interface and to detect when the first bank is a final bank of the plurality of banks and, in response, to modify the value in the row refresh register.

10. The memory device of claim 9 wherein the control circuitry is further configured to refresh a row in a second bank of the plurality of banks concurrently with refreshing the first row.

11. The memory device of claim 9 wherein the control circuitry is configured to refresh the first row by activating the first row.

12. A memory system comprising:
a memory controller;
a memory device having a row refresh register and a plurality of memory banks that each include a plurality of rows of memory cells; and
a communication path coupled between the memory device and the memory controller, the memory controller being configured to transmit a first refresh command to the memory device via the communication path, the memory device being configured to respond to the first refresh command by refreshing a first row of the plurality of rows, the first row being specified by a bank identifier in the first refresh command and a row identifier in the row refresh register;
wherein the memory controller is further configured to transmit a second refresh command that identifies a second bank of the plurality of banks before the memory device has completed refreshing the first row.

13. A memory device comprising:
a plurality of memory banks, each memory bank of the plurality of memory banks including a plurality of rows of memory cells;
a bank register to hold a bank address indicative of one bank of the plurality of banks;
a row refresh register to hold a row address for use only during refresh operations;
control circuitry, coupled to the bank register, the row refresh register and the plurality of banks, to perform a refresh operation on a row included in the bank indicated by the bank address, the row indicated by the row address in the row refresh register; and
an interface coupled to the bank register to output the bank address from the memory device in response to a command to read the bank address.

14. The memory device of claim 13 wherein the control circuitry is configured to automatically modify the bank address in the bank register after initiating the refresh operation.

15. The memory device of claim 13 wherein the control circuitry is further configured to compare the bank address to a predetermined bank address and to modify the row address in response to determining that the bank address matches the predetermined bank address.

16. A method of controlling a memory device organized in memory banks that each include a plurality of rows of memory cells, the method comprising:
issuing a first command to the memory device to place the memory device in an operating state in which control circuitry within the memory device sequentially refreshes rows of memory cells identified, at least in part, by an address value stored in a register within the memory device; and
issuing a second command to the memory device to command the memory device to output the address value stored in the register.

17. The method of claim 16 wherein the address value is an address that identifies one of the memory banks.

18. The method of claim 16 wherein issuing a first command to the memory device to place the memory device in an operating state in which control circuitry within the memory device sequentially refreshes rows comprises issuing a command to place the memory device into a reduced power state.

19. The method of claim 16 wherein issuing a first command to the memory device to place the memory device in an operating state in which control circuitry within the memory device sequentially refreshes rows comprises commanding the memory device to operate in a state in which the control circuitry sequentially refreshes rows of memory cells identified by respective combinations of row and bank addresses, each row and bank address combination being formed by a row address value stored in a row refresh register of the memory device and a bank address value stored in a bank register of the memory device.

20. A method of controlling a memory device having a row refresh register, the memory device being organized into memory banks, each memory bank including a plurality of rows of memory cells, the method comprising:
issuing memory access commands to the memory device to access the rows of memory cells therein;
issuing to the memory device, between any two of the memory access commands, a predetermined number of refresh commands in succession to initiate interleaved refresh operations on respective memory banks of the memory device at a row indicated by a first row value in the row refresh register, wherein the predetermined number of refresh commands is greater than one.

21. The method of claim 20 wherein the predetermined number of refresh commands is equal to the number of memory banks in the memory device.

22. The method of claim 20 wherein each of the refresh commands is a command sequence that comprises a first refresh primitive command to initiate an activate operation on the row indicated by the first row value in a memory bank indicated by a bank address associated with the first refresh primitive command, and a second refresh primitive command to initiate a precharge operation on the memory bank that includes the row for which the activate operation was initiated; and
the method includes issuing a plurality of the refresh primitive commands, for refreshing the row indicated by the first row value in a like plurality of memory banks, prior to issuing corresponding second refresh primitive commands to perform the precharge operation on the plurality of memory banks for which the first refresh primitive commands were issued.

23. The method of claim 20 wherein the predetermined number of refresh commands is issued by a memory controller, the method for controlling further comprising storing a value representative of the predetermined number into a storage element in the memory controller.

24. The method of claim 20 further comprising detecting when a predetermined period of time has elapsed since issuing the predetermined number of refresh commands to the memory device and, in response, repeating issuance of the predetermined number of refresh commands to the memory device to initiate interleaved refresh operations on the respective banks of the memory device at a row indicated by a second row value in the row refresh register.

25. The method of claim 24 wherein the first row value is automatically incremented by the memory device, after receipt of a last one of the predetermined number of refresh commands, to generate the second row value.

26. The method of claim 20 further comprising issuing to the memory device a predetermined number of bank addresses that correspond respectively to the predetermined number of refresh commands, each of the bank addresses identifying a respective bank of the memory device in which the row indicated by the first row value is located.

27. The method of claim 26 wherein each bank address of the predetermined number of bank addresses is included in a command packet along with a corresponding one of the predetermined number of refresh commands.

28. The method of claim 26 wherein the predetermined number of bank addresses correspond to respective memory banks of the memory device according to a bank address pattern that prevents overlapping refresh operations from being performed on memory banks that share an array of sense amplifiers.

29. The method of claim 28 wherein the bank address pattern is a predetermined pattern of bank addresses stored in a storage element.

30. The method of claim 28 further comprising generating each bank address in the bank address pattern using modulo arithmetic.

31. A method of operation within a memory device that includes a plurality of memory banks organized in rows of memory cells, and a row refresh register:

receiving a refresh command that includes a device identification value and a bank address;

comparing the device identification value with a device identifier within the memory device; and refreshing a row of memory cells indicated by the row refresh register within a bank of the plurality of memory banks indicated by the bank address if the device identification value matches the device identifier within the memory device.

32. The method of claim 31 further comprising:

determining if the refresh command includes a broadcast flag; and refreshing the row of memory cells indicated by the row refresh register within one of the plurality of banks indicated by the bank address irrespectively of whether the device identification value matches the device identifier within the memory device if the broadcast flag is included in the refresh command.

33. The method of claim 32 wherein determining if the refresh command includes a broadcast flag comprises comparing at least one bit of the refresh command against a predetermined value.

34. The method of claim 31 wherein comparing the device identification value with a device identifier within the memory device comprises comparing identifier bits stored within the memory device with bits that form the device identification value.

35. A method of initiating a refresh operation within a memory system that includes a plurality of dynamic random access memory (DRAM) devices coupled to a communication path, the method comprising outputting on the communication path a first refresh command including a device identification value that matches a device identification value within at least one of the DRAM devices, and a bank address that indicates one bank of a plurality of banks of memory cells within the at least one of the DRAM devices upon which the refresh operation is to be performed.

36. The method of claim 35 wherein outputting the first refresh command comprises outputting portions of the first refresh command on the communication path in response to respective transitions of a clock signal.

37. The method of claim 35 wherein each portion of the first refresh command is formed by a plurality of signals.

38. The method of claim 35, wherein the first refresh command further includes a disabled broadcast flag;

the method further including outputting on the communication path a second refresh command including an enabled broadcast flag indicating that a refresh operation is to be carried out by each DRAM device of the plurality of DRAM devices, and a bank address that indicates a respective bank of a plurality of banks of memory cells within each of the DRAM devices upon which the refresh operation is to be performed.

39. The method of claim 38 wherein outputting the second refresh command comprises outputting a plurality of portions of the second refresh command on the communication path in response to a respective plurality of transitions of a clock signal.

40. The method of claim 38 wherein the first and second refresh commands do not indicate a row address.

* * * * *

UNITED STATES PATENT AND TRADEMARK OFFICE
CERTIFICATE OF CORRECTION

PATENT NO. : 6,310,814 B1
DATED : October 30, 2001
INVENTOR(S) : Craig E. Hampel, Richard M. Barth, Paul G. Davis, Bradley A. May, Ramprasad Satagopan, Frederick A. Ware It is certified that error appears in the above-identified patent and that said Letters Patent is hereby corrected as shown below:

Title page,
Item [54], please replace the title with -- DRAM APPARATUS AND METHOD FOR PERFORMING REFRESH OPERATIONS --.

Signed and Sealed this

Twelfth Day of March, 2002

Attest:

JAMES E. ROGAN
*Attesting Officer*  *Director of the United States Patent and Trademark Office*